United States Patent
Okuda et al.

(10) Patent No.: US 6,748,649 B2
(45) Date of Patent: Jun. 15, 2004

(54) METHOD OF OPERATING A COMPONENT HOLDING HEAD

(75) Inventors: Osamu Okuda, Hirakata (JP); Akira Kabeshita, Hirakata (JP); Satoshi Shida, Katano (JP); Makoto Sueki, Kofu (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 184 days.

(21) Appl. No.: 10/023,792

(22) Filed: Dec. 21, 2001

(65) Prior Publication Data

US 2002/0050060 A1 May 2, 2002

Related U.S. Application Data

(62) Division of application No. 09/331,689, filed on Jun. 23, 1999, now Pat. No. 6,343,415.

(30) Foreign Application Priority Data

Dec. 25, 1996 (JP) ............................................. 8-345069

(51) Int. Cl.⁷ ................................................. H05K 3/30
(52) U.S. Cl. ............................. 29/740; 29/739; 29/741; 29/743; 29/721; 29/759; 29/DIG. 44; 29/832; 29/833; 901/40; 414/737; 414/751.1; 414/752.1; 294/64.1
(58) Field of Search ........................ 29/740, 739, 741, 29/743, 721, 759, DIG. 44, 833, 872; 901/40; 414/737, 751.1, 752.1; 294/64.1

(56) References Cited

U.S. PATENT DOCUMENTS

| | | |
|---|---|---|
| 4,632,018 A | 12/1986 | Lymburner |
| 4,705,311 A | 11/1987 | Ragard |
| 4,951,383 A | 8/1990 | Amao et al. |
| 5,231,374 A | 7/1993 | Larsen et al. |
| 5,338,907 A | 8/1994 | Baker et al. |
| 5,379,514 A | 1/1995 | Okuda et al. |
| 5,446,323 A * | 8/1995 | Neff et al. ..................... 310/12 |
| 5,499,443 A | 3/1996 | Ota et al. |
| 5,648,690 A | 7/1997 | Hinds |
| 5,741,114 A | 4/1998 | Onodera |
| 5,758,410 A | 6/1998 | Asai et al. |
| 5,894,657 A | 4/1999 | Kanayama et al. |
| 6,000,122 A * | 12/1999 | Uchida et al. ................ 29/740 |
| 6,133,730 A | 10/2000 | Winn |
| 6,161,886 A | 12/2000 | Furuya et al. |

FOREIGN PATENT DOCUMENTS

| | | |
|---|---|---|
| EP | 0 701 326 | 3/1996 |
| JP | 57-37202 | 3/1982 |
| JP | 61-164802 | 10/1986 |
| JP | 62-246495 | 10/1987 |
| JP | 2-159958 | 6/1990 |
| JP | 2-45360 | 10/1990 |
| JP | 4-155998 | 5/1992 |
| JP | 4-164398 | 6/1992 |
| JP | 7-266154 | 10/1995 |
| JP | 10163686 A | 12/1996 |
| JP | 11068389 A | 8/1997 |
| JP | 7-266154 | 10/1997 |
| JP | 11121989 A | 10/1997 |
| JP | 11198079 A | 11/1997 |

* cited by examiner

Primary Examiner—Richard Chang
(74) Attorney, Agent, or Firm—Wenderoth, Lind & Ponack, L.L.P.

(57) ABSTRACT

A holding head includes an axially driveable shaft having a nozzle at one end of the shaft for holding a component, a motor for driving the shaft in an axial direction in response to power supplied to the motor, and a detecting device for detecting movement of the shall in the axial direction. A method of operating the component holding head comprises using the detecting device to detect movement of the shaft in the axial direction resulting from the shaft being driven by the motor, and controlling power supplied to the motor in response to the movement of the shaft as detected by the detecting device such that the distance that the shaft is driven by the motor in the axial direction is controlled.

6 Claims, 6 Drawing Sheets

A component holding head for use, e.g., in mounting electronic components on electronic circuit boards, a component mounting apparatus equipped with the component holding head, and a component hold method carried out by the component mounting apparatus.

METHOD OF OPERATING A COMPONENT HOLDING HEAD

This is a divisional of U.S. application Ser. No. 09/331,689, filed Jun. 23, 1999, now U.S. Pat. No. 6,343,415.

BACKGROUND OF THE INVENTION

1. Technical Field

The present invention relates to a component holding head for use, e.g., in mounting electronic components on electronic circuit boards, a component mounting apparatus equipped with the component holding head, and a component hold method carried out by the component mounting apparatus.

2. Background Art

A component suction head part set in a component mounting apparatus adapted to automatically mount electronic components onto electronic circuit boards has nozzles to suck and mount the electronic components to the electronic circuit boards. Lately, precise control of the nozzles coming into contact with electronic components during sucking and mounting of the electronic components is considered as one of factors to improve quality of the electronic circuit boards to be produced. An example of the conventional electronic component mounting apparatus will be described with reference to FIG. 4.

FIG. 4 shows a component suction head part 101 including the aforementioned nozzles, a sucking device 103 for sucking the electronic components with the use of the nozzles, an X-Y robot 102 moving the head part 101 in X, Y directions, and a control device 104 controlling operations of the head part 101, the X-Y robot 102, and the sucking device 103 in the conventional electronic component mounting apparatus. The head part 101 is constructed as will be described below. Only essential parts constituting the head part 101 are indicated in FIG. 4 and, for instance, a body part of the head part 101 and the like are not illustrated. Reference numeral 135 in FIG. 4 is a spline shaft which has a nozzle 136 set at one end part 135a for sucking an electronic component 138 through a suction action, and a rotation receiver 143 at the other end part 135b. The suction action is conducted by the sucking device 103, whereby the air is guided into the sucking device 103 through the nozzle 136 and the spline shaft 135. Two nuts 131, 134 are fitted to the spline shaft 135 in an axial direction of the spline shaft 135 to make the spline shaft 135 slidable in the axial direction. These nuts 131, 134 are held to the body part (not shown) of the head part 101 via respective bearings 132, 133. The spline shaft 135 is accordingly rendered movable in the axial direction and rotatable in a circumferential direction relative to the body part.

The rotation in the circumferential direction of the spline shaft 135 is achieved by a motor 142. Specifically, a pulley 139 rotating along with the spline shaft 135 is fitted to the spline shaft 135. The spline shaft 135 is movable in the axial direction relative to the pulley 139. A pulley 141 is attached to a driving shaft of the motor 142 and is coupled to the pulley 139 via a belt 140. When the motor 142 rotates the pulley 141, the spline shaft 135 is accordingly rotated in the circumferential direction via the belt 140 and the pulley 139.

Meanwhile, the movement in the axial direction of the spline shaft 135 is caused by a motor 149. More specifically, a nut 146, whereat a lever 147 projects, is meshed with a ball screw 145 connected to a driving shaft of the motor 149 via a coupling 148. A roller 144 at a leading end of the lever 147 is engaged with a groove 143a formed in the rotation receiver 143. When the ball screw 145 is rotated by the motor 149, the lever 147 moves in the axial direction while the roller 144 is engaged with the rotation receiver 143, thereby moving the spline shaft 135 in the axial direction.

The conventional component mounting apparatus of the above constitution operates in the following manner.

When the X-Y robot 102 operates under the control of the control device 104, the head part 101 is moved to a component suction position where the electronic component is to be sucked. The motor 149 is driven under the control of the control device 104, thereby lowering the spline shaft 135 and the nozzle 136. At the same time, the sucking device 103 is driven to make the nozzle 136 suck the electronic component. Subsequently, the ball screw 145 is rotated backward by the motor 149 to raise the nozzle 136. In order to correct a mount direction of the sucked electronic component, the motor 142 is driven through the control action of the control device 104 to rotate the nozzle 136 to a proper position. The X-Y robot is driven again to move the head part 101 to a component mount position above the electronic circuit board, and then the motor 149 is driven to lower the nozzle 136. The electronic component 138 is thus mounted on the electronic circuit board.

The above-described constitution of the conventional component mounting apparatus has drawbacks, though.

In these days, the component mounting apparatus is adapted to handle not only electronic components, in which silicon substrates having electronic circuits formed thereon are sealed with resin material, but bare ICs and the like. In the case of bare ICs, a mount pressure by the nozzle 136 to the bare ICs at the time of mounting is required to be controlled to prevent damage to the bare ICs. Therefore, the component mounting apparatus is constituted to correctly manage a position of the nozzle 136 relative to the bare ICs in X, Y directions, and also to manage the pressure of the nozzle 136 on the bare ICs on the basis of a torque of the motor 149 moving the nozzle 136 up and down. Although a sensor is preferred to be directly installed at the nozzle 136 in the component mounting apparatus to correctly measure the position of the nozzle 136 in the X, Y directions and an up-down direction, it is impossible to set the sensor to the spline shaft which moves in the axial direction and the circumferential direction as described above. As such, the position of the nozzle 136 in the up-down direction is actually controlled on the basis of output information from a rotary encoder 150 incorporated in the motor 149.

On the other hand, the position of the spline shaft 135 in the axial direction is hard to correctly grasp, because the movement of the spline shaft 135 in the axial direction is carried out via the rotation receiver 143 and the roller 144, etc., which is dependent on movement accuracy of the ball screw 145 in the axial direction. Moreover, the rotation receiver 143 and the roller 144, etc. are formed of non-rigid material. Under the circumstances, the conventional electronic component mounting apparatus finds difficulty in accurate control of the movement of a leading end of the nozzle, resulting in an impediment to improvement of mount quality.

The present invention is devised to solve the aforementioned drawbacks and has for its object to provide a component holding head, a component mounting apparatus equipped with the component holding head, and a component hold method executed by the component mounting apparatus, which can improve mount quality of components to articles to which the components are to be mounted.

SUMMARY OF THE INVENTION

In accomplishing this and other objects, the present invention is constituted as described below.

According to a first aspect of the present invention, there is provided a component holding head equipped with a shaft which has a nozzle, for holding a component, set at one end part of the shaft and is driven in an axial direction thereof. A magnet is fixed to a circumferential face of the shaft and a coil is disposed around the magnet, thereby constituting a voice coil motor for driving the shaft in the axial direction, so that movement of the shaft in the axial direction is controlled through control of power supply to the voice coil motor.

According to a second aspect of the present invention, there is provided a component holding head according to the first aspect, further comprising a detecting device which is installed at the shaft for detecting the movement of the shaft in the axial direction, so that an amount of the movement of the shaft in the axial direction by the voice coil motor is controlled on the basis of a detection result of the detecting device.

According to a third aspect of the present invention, there is provided a component holding head according to the second aspect, wherein the detecting device comprises a member to be detected which extends concentrically with the shaft. The member is directly fitted to the other end part of the shaft and moves in the axial direction in accordance with the movement of the shaft in the axial direction. The detecting device also includes a sensor for detecting movement of the member to be detected.

According to a fourth aspect of the present invention, there is provided a component holding head, according to the third aspect, wherein the member to be detected is a magnetic scale, and the component holding head further comprises a transmission sensor set in a noncontact state to detect presence/absence of blockage of light by a leading end of the magnetic scale, thereby detecting an origin position of the movement of the shaft.

According to a fifth aspect of the present invention, there is provided a component holding head according to the second aspect, wherein the detecting device comprises a sensor which is directly set at the other end part of the shaft via a bearing so as to be prevented from rotating together with the shaft when the shaft is driven in a circumferential direction, while being allowed to move in the axial direction in accordance with the movement of the shaft in the axial direction. The detecting device also includes a member to be detected by the sensor which extends parallel to the axial direction of the shaft.

According to a sixth aspect of the present invention, there is provided a component mounting apparatus for mounting components, which is equipped with the component holding head according to any one of the first through fifth aspects.

According to a seventh aspect of the present invention, there is provided a component mounting apparatus according to the sixth aspect, further comprising a detecting device which is set at the shaft to detect the movement of the shaft in the axial direction. The component mounting apparatus further includes a control device which controls an amount of the movement of the shaft in the axial direction caused by the voice coil motor on the basis of a detection result of the detecting device.

According to an eighth aspect of the present invention, there is provided a component mounting apparatus according to either the sixth aspect or the seventh aspect, wherein the shaft is movably arranged relative to a casing of the voice coil motor, with a nozzle suction pipe installed at the casing. An opening, communicating with a through hole or passage in the shaft, penetrates the shaft to communicate with the nozzle and opens into the casing, whereby the nozzle suction pipe and the opening are communicated with each other via the interior of the casing.

According to a ninth aspect of the present invention, there is provided a component hold method which is carried out with the use of a component holding head having a shaft which is equipped with a nozzle, for holding a component, at one end part of the shaft and is driven in an axial direction thereof. A magnet is fixed to a circumferential face of the shaft and a coil is arranged around the magnet, thereby constituting a voice coil motor for driving the shaft in the axial direction.

The method comprises detecting the movement of the shaft in the axial direction, caused by the voice coil motor, by a detecting device installed at the shaft, and further comprises controlling power supply to the voice coil motor on the basis of a detection result of the detecting device, thereby controlling a movement amount of the shaft in the axial direction to hold the component.

According to a tenth aspect of the present invention, there is provided a component hold method according to the ninth aspect, wherein a magnetic scale, which is a member to be detected of the detecting device, is provided along with a transmission sensor that is set in a state without contacting the magnetic scale. The transmission sensor detects presence/absence of blockage of light by a leading end of the magnetic scale 28, thereby detecting an origin position of the movement of the shaft.

BRIEF DESCRIPTION OF DRAWINGS

These and other aspects and features of the present invention will become clear from the following description taken in conjunction with the preferred embodiments thereof with reference to the accompanying drawings, in which.

DESCRIPTION OF THE PREFERRED EMBODIMENTS

Figure 1:
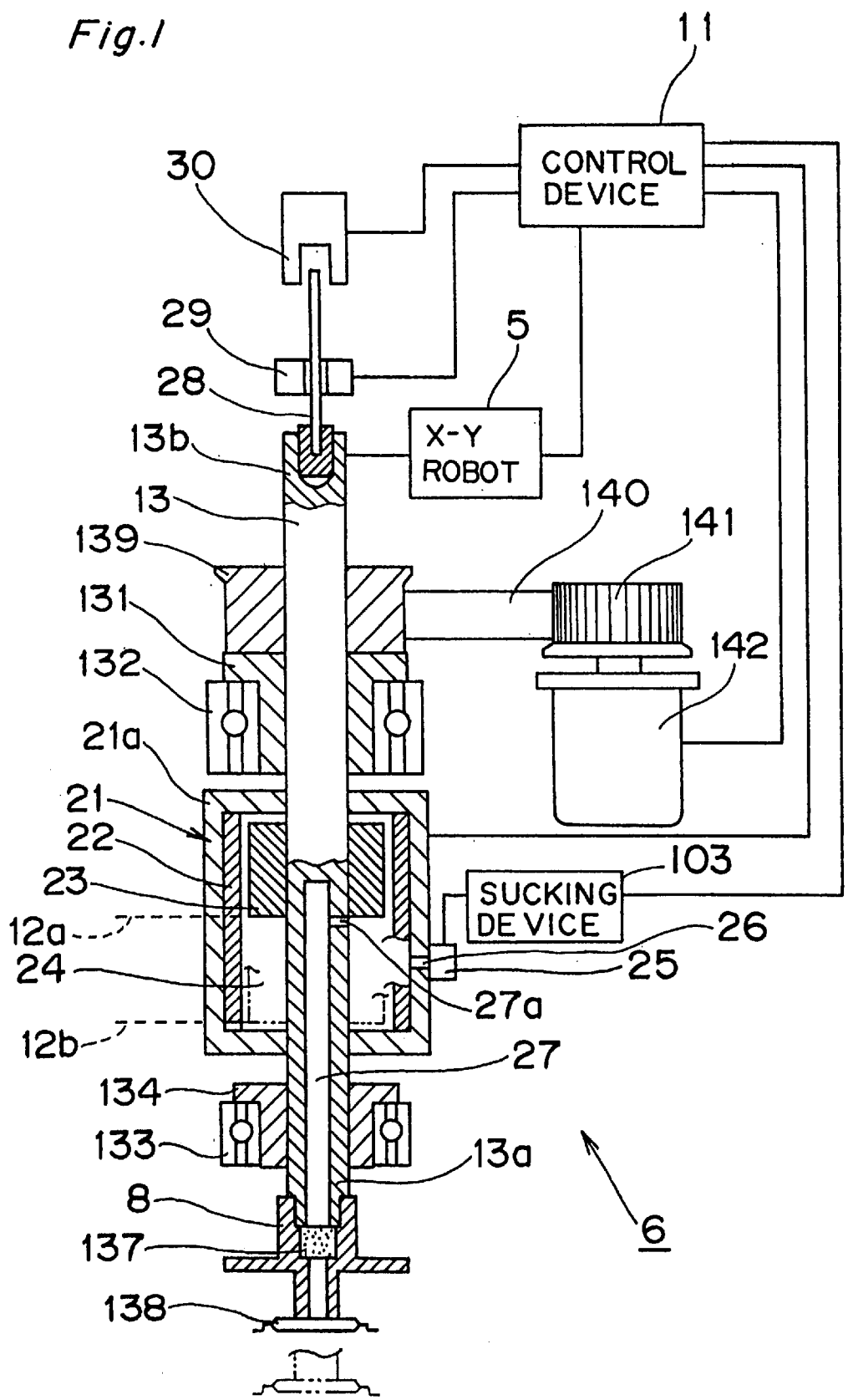
FIG. 1 is a view of the construction of a component holding head in one embodiment of the present invention.

Before the description of the present invention proceeds, it is to be noted that like parts are designated by like reference numerals throughout the accompanying drawings.

A first embodiment of the present invention will be described in detail below with reference to the drawings.

Figure 4:
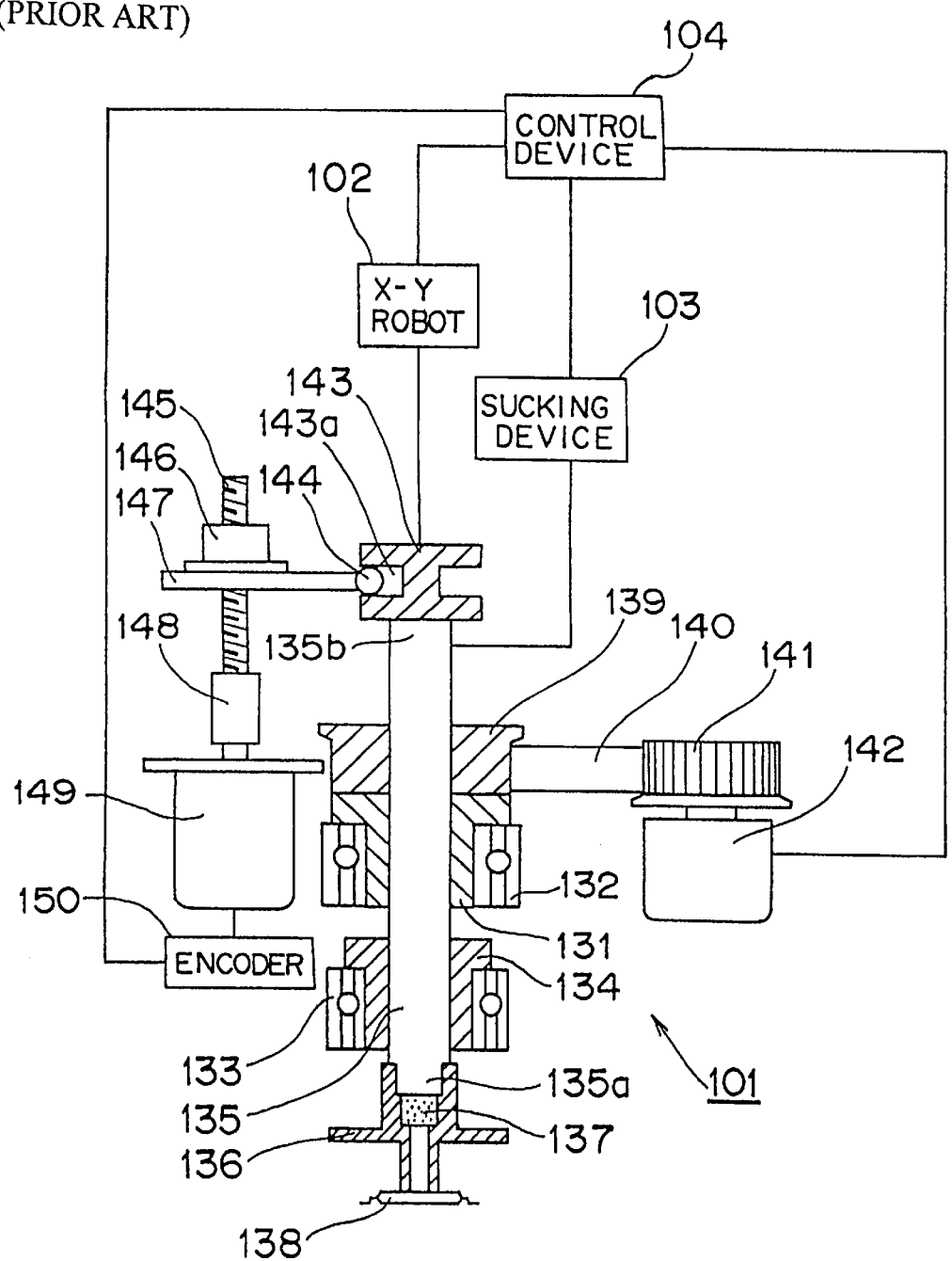
FIG. 4 is a view showing the structure of a conventional component holding head.

A component holding head, a component mounting apparatus equipped with the component holding head, and a component hold method carried out by the component mounting apparatus, according to one preferred embodiment of the present invention will be described with reference to the drawings. The same parts in each drawing including FIG. 4 used in the foregoing description are denoted by the same reference numerals and the detailed description will be omitted here. An embodiment functioning as the component holding head corresponds to a component suction head part 6. An electronic component and an electronic circuit board are exemplified as an example of the component and an example of the article to which the component is mounted, respectively.

Figure 2:
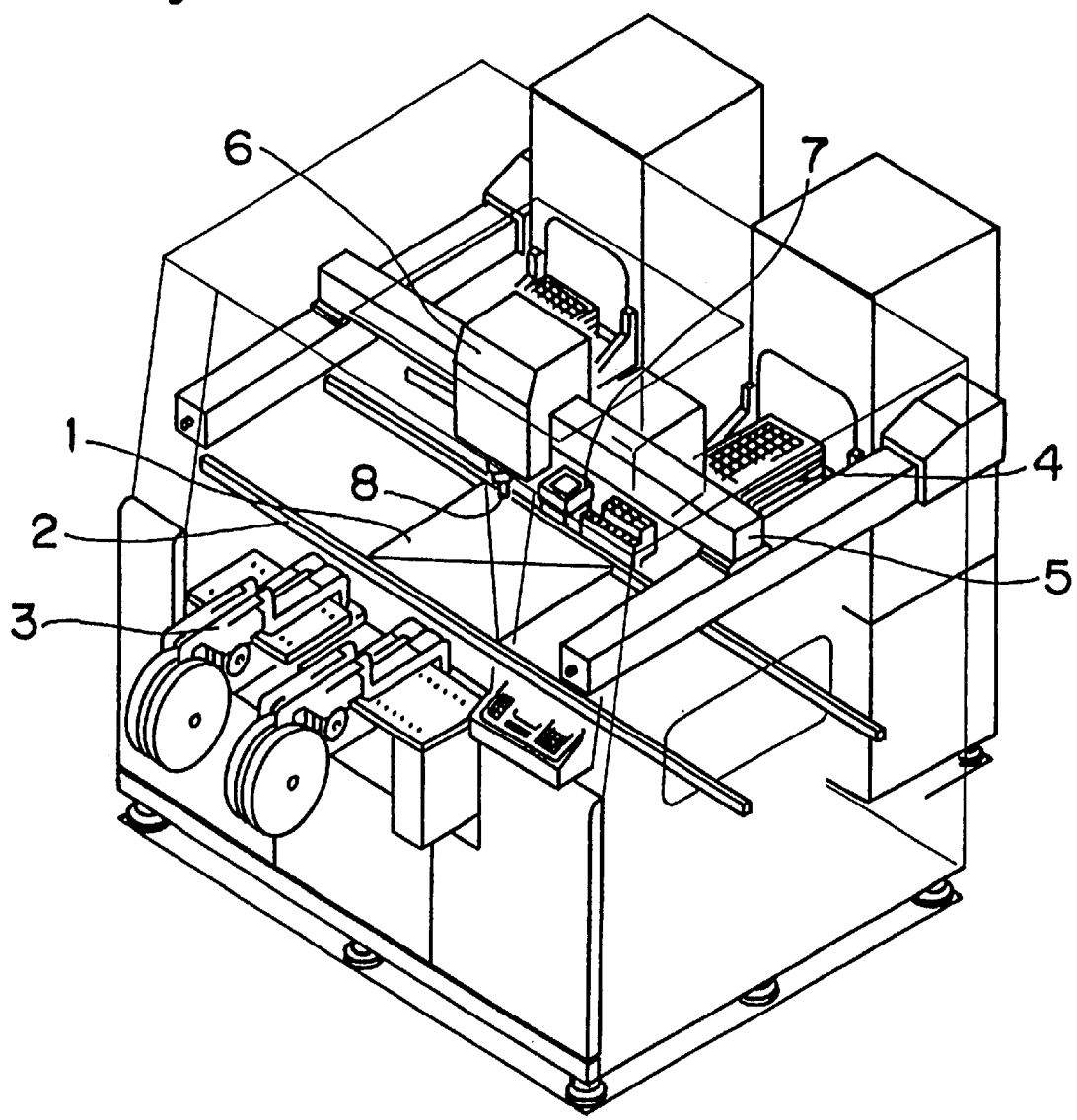
FIG. 2 is a perspective view of a component mounting apparatus equipped with the component holding head of FIG. 1.

FIG. 2 schematically shows the whole of the component mounting apparatus of the embodiment. 2 is a transfer part for carrying in, carrying out electronic circuit boards 1, and holding the circuit boards 1 on the occasion of production. 3 and 4 are electronic component feed parts storing and feeding electronic components to be mounted to the circuit boards 1. The electronic component feed part 3 is a reel-type electronic component feed part wherein electronic components are accommodated in a reel, while the electronic component feed part 4 is a tray-type electronic component feed part wherein the electronic components are stored in a tray. A component suction head part 6 equipped with a nozzle 8 for sucking of an electronic component moves the nozzle 8 up, down, and rotates the nozzle. The component suction head part 6 is mounted to an X-Y robot 5 for moving the head part 6 in X, Y directions. At the suction time of electronic components, the head part 6, namely, the nozzle 8 is moved by the X-Y robot 5 to an electronic component hold position at the electronic component feed part 3 or 4 and then lowered to suck the electronic component. The nozzle 8 is moved up after sucking the electronic component. An image of a suction state of the electronic component sucked by the nozzle 8 is picked up by a component recognition camera 7. Whether a suction angle of the electronic component is to be corrected or not, etc., is judged on the basis of the picked-up image information before the electronic component is mounted to the electronic circuit board 1. The electronic component sucked by the nozzle 8 is moved in the X, Y directions through the movement of the head part 6 caused by the X-Y robot 5 to a predetermined position above the electronic circuit board 1. The nozzle 8 is lowered by an operation of the head part 6, so that the electronic component is mounted to a predetermined component mount position on the electronic circuit board 1. The electronic component sucked by the nozzle 8 is released at this time. Through repetition of the above sequence of operations, each electronic component is mounted from the electronic component feed part 3 or 4 onto the electronic circuit board 1.

FIG. 1 shows the component suction head part 6 having the nozzle 8, the above-described X-Y robot 5, a sucking device 103 for sucking of an electronic component with the nozzle 8, and a control device 11 for controlling operations of the component suction head part 6, the X-Y robot 5, and the sucking device 103. While the X-Y robot 5 is illustrated in FIG. 1 for the sake of convenience as if to directly drive a spline shaft 13 having the nozzle 8, practically, as described above, the X-Y robot 5 moves the head part 6 thereby driving the spline shaft 13.

Although it will be detailed later, according to the embodiment in contrast to the prior art, a voice coil motor is set at the spline shaft 13 to move in an axial direction the spline shaft 13 having the nozzle 8 fixed at a leading end part 13*a* thereof, and further a detecting device is fitted to the spline shaft 13 so as to detect a movement amount of the spline shaft 13 in the axial direction. The constitution in other points is similar to that in the head part 101 of the prior art, and therefore the other points of the similar constitution will be depicted schematically.

Two nuts 131, 134 are fitted in the axial direction of the spline shaft 13 to allow the spline shaft 13 to slide in the axial direction. The nuts 131, 134 are supported to a body part (not shown) of the component suction head part 6 via respective bearings 132, 133. The spline shaft 13 is accordingly movable in the axial direction and rotatable in a circumferential direction relative to the body part. The rotation in the circumferential direction of the spline shaft 13 is carried out by a motor 142 set at the component suction head part 6 via a belt 140. The motor 142 is connected to the control device 11. A rotation angle in the circumferential direction of the spline shaft 13 is calculated by the control device 11 based on, e.g., a signal sent out from an encoder set at the motor 142. The operation of the motor 142 is feedback-controlled on the basis of a calculation result, thereby controlling the rotation angle. The nozzle 8 is set at the leading end part 13*a* of the spline shaft 13 to suck an electronic component 138. A filter 137 is disposed inside the nozzle 8 to prevent invasion of dust at the suction time. An air hole or passage 27 is formed in the spline shaft 13 in the axial direction from the leading end part 13*a* to an internal part of the voice coil motor 21 which will be described later. The air hole becomes a path for the air sucked through the filter 137. The air hole 27 communicates with an interior 24 of the voice coil motor 21 through a shaft opening 27*a* opened in a diametrical direction of the spline shaft 13.

The voice coil motor 21 is to drive the spline shaft 13. Specifically, a part of the spline shaft 13 is held between the bearings 132 and 133 for supporting the spline shaft 13 rotatably relative to the body part of the component suction head part 6. A magnet 23 is fixed to a circumferential face of the spline shaft 13. A voice coil 22 is installed around the periphery of the magnet 23, in a noncontact state with the magnet 23, parallel to the axial direction of the spline shaft 13 to move in the axial direction of the spline shaft 13 within a casing 21*a* of the voice coil motor 21. The voice coil motor 21 is connected to the control device 11 of the component mounting apparatus and controlled to be driven by the control device 11. That is, when power is supplied to the voice coil 22, the magnet 23 of the voice coil motor 21 moves between an up position 12*a* and a down position 12*b*, thereby moving the spline shaft 13 and the nozzle 8 in the axial direction. The voice coil motor 21 can be constructed alternatively to have the voice coil fixed to the circumferential face of the spline shaft 13, with the magnet set around the periphery of the voice coil, in a noncontact state with the voice coil, parallel to the axial direction of the spline shaft 13 to move in the axial direction of the spline shaft 13.

A hole 26 is provided in the casing 21*a* of the voice coil motor 21 so as to guide the air entering the interior 24 of the voice coil motor 21 through the air hole 27 and the shaft opening 27*a* in the spline shaft 13 to the outside of the voice coil motor 21 for suction. An air joint 25 is provided at a part of a surface of the casing 21*a* where the hole 26 is provided. The air joint 25 is connected to the sucking device 103 of the component suction head part 6 or component mounting apparatus via a hose. The sucking device 103 is controlled in operation by the control device 11. Accordingly, the air is sucked through a suction action of the sucking device 103 from a leading end of the nozzle 8 via the hole 26, the interior 24 of the voice coil motor 21, the shaft opening 27*a*, the air hole 27, and the filter 137, so that the electronic component 138 is sucked to the leading end of the nozzle 8.

An effect exhibited when the sucking device 103 is arranged as above will be discussed in detail.

Figure 6:
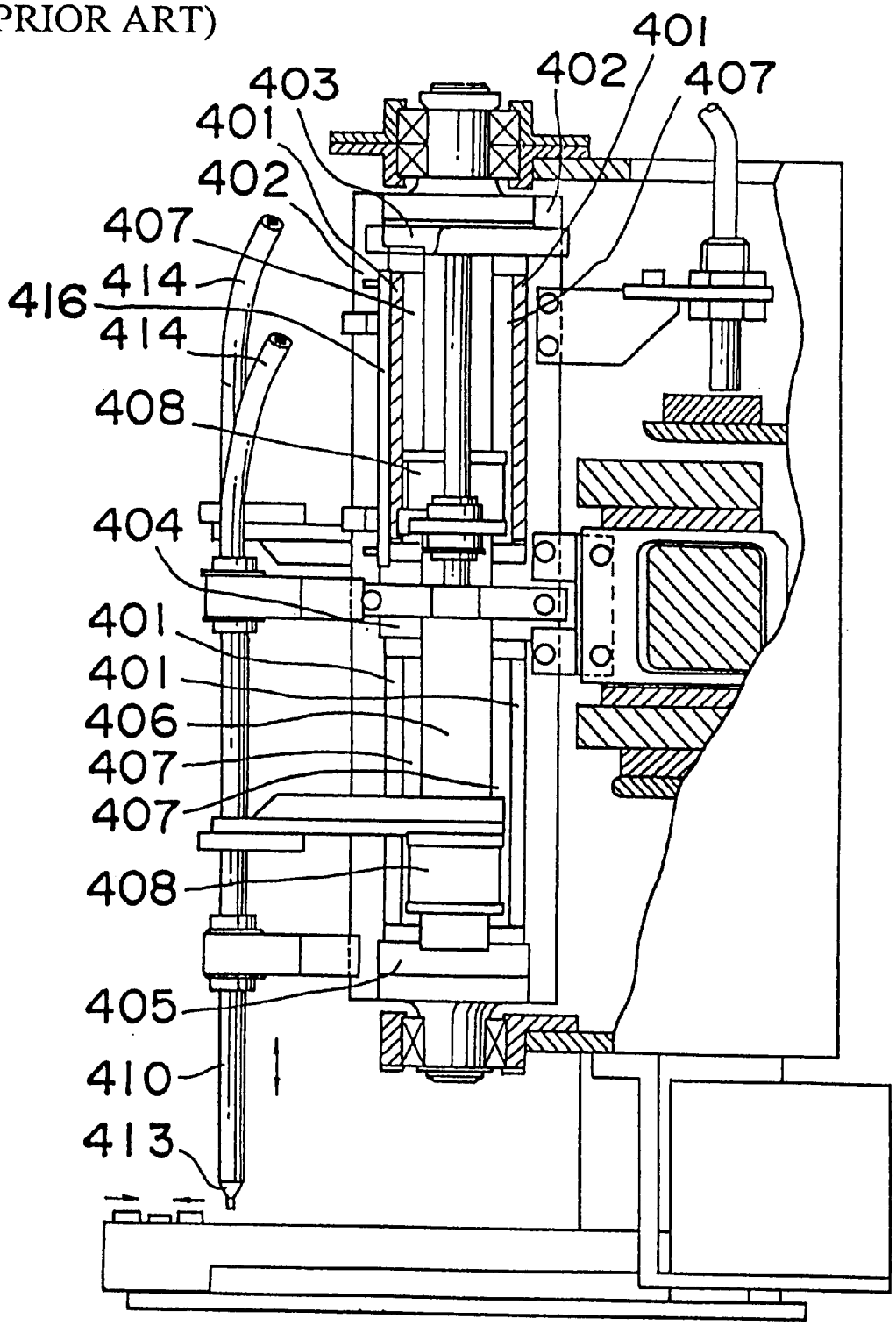
FIG. 6 is a conventional component mounting apparatus using a linear motor.

A component mounting apparatus using a linear motor has been suggested heretofore as shown in FIG. 6. In FIG. 6, 401 is a permanent magnet, 402, 403, 404, 405, and 406 are yokes formed of material of a large magnetic permeability, and 407 is a gap constituting a magnetic circuit which generates a constant magnetic field by the permanent magnet and the yokes. 408 is a bobbin having a wire wound therearound, generating a thrust when a current is fed thereto. A slide shaft 410 is fixed to the bobbin 408. A component suction vacuum nozzle 413 is fixed to a lower end of the slide shaft 410. 416 is a linear potentiometer for up-down movement detection fitted to the yoke 402 to detect an origin and the present position of the slide shaft 410.

In the thus-constituted apparatus, a tube 414 connecting the vacuum nozzle 413 with a vacuum generation apparatus protrudes from an upper end of the slide shaft 410, moving with up-down and horizontal movements of the slide shaft 410. The tube 414 unavoidably comes in contact with other members during the movement, thus increasing frictional resistance and causing resistance to a driving force of the slide shaft 410 and eventually obstructing smooth up-down movement of the nozzle 413.

To the contrary, in the embodiment of the present invention, a pipe for the suction action is fixed to the casing 21a of the voice coil motor 21, and thereby does not trace the up-down movement and a movement within a schematically horizontal plane of the nozzle 8. The frictional resistance and driving resistance resulting in the conventional apparatus are eliminated, and accordingly the nozzle 8 can move smoothly up and down. Since only a magnetic scale 28 without a wiring moves along with the spline shaft 13 while a magnetic sensor 29 having a wiring does not move, as will be detailed later, generation of the frictional resistance and driving resistance due to the wiring is avoided in the present embodiment, which is different from the conventional apparatus, thereby enabling smooth up-down movement of the nozzle 8.

The rod-shaped magnetic scale 28 is fitted at another end part 13b of the spline shaft 13 concentrically with the spline shaft 13 and in parallel to the axial direction of the spline shaft 13, The magnetic scale 28 and a magnetic scale 20 to be described later correspond to members to be detected. S poles and N poles are alternately magnetized via a constant distance in an axial direction of the magnetic scale 28. The reason why the magnetic scale 28 is disposed concentrically with the spline shaft 13 is that the magnetic scale 28 is prevented from rotating in a circle in response to the circumferential rotation of the spline shaft 13 by the motor 142, thereby facilitating magnetic detection by the magnetic sensor 29 described later.

In order to detect the magnetism of the magnetic scale 28, the magnetic sensor 29 is secured to the component suction head part 6 in a state without contacting the magnetic scale 28. A change of magnetism because of the movement of the magnetic scale 28 in the axial direction resulting from the axial movement of the spline shaft 13 is detected by the magnetic sensor 29. Detected information is sent to the control device 11 from the magnetic sensor 29. A transmission sensor 30 is securely set at the component suction head part 6 at a leading end part of the magnetic scale 28 to detect an origin of the 20 movement of the spline shaft 13. The transmission sensor 30 is fixed in a noncontact state with the magnetic scale 28. The transmission sensor 30 is, for instance, a photosensor having light-emitting and photodetecting elements for detecting the presence/absence of blockage of light at the leading end of the magnetic scale 28 and sending a detected result to the control device 11. The above-described magnetic scale 28, magnetic sensor 29, and transmission sensor 30 correspond to one embodiment of the detecting device.

Figure 5:
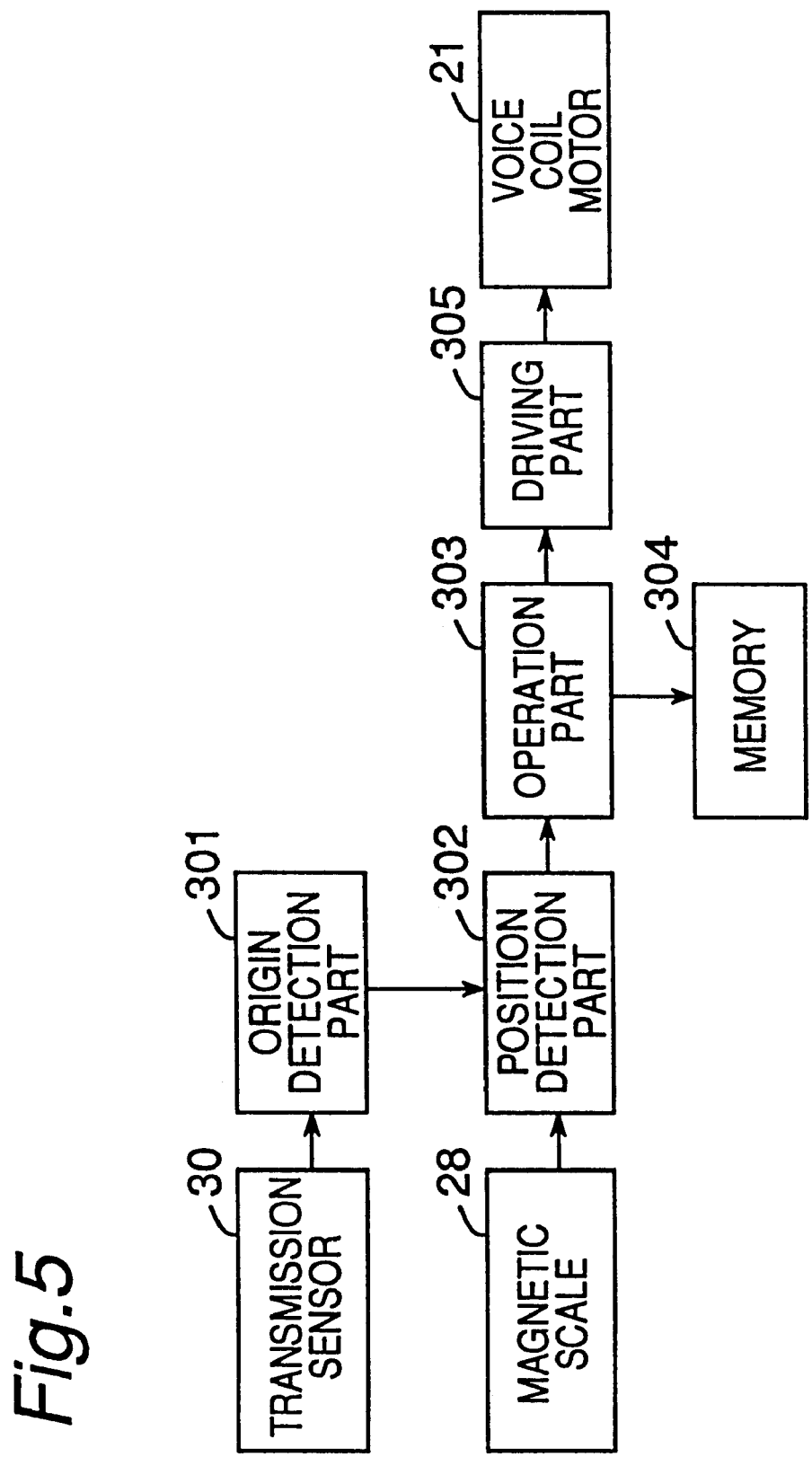
FIG. 5 is a block diagram showing how a voice coil motor of the component holding head of the one embodiment is controlled.

As shown in FIG. 5, the control device 11 judges as the origin, by an origin detection part 301 based on the detected result fed from the transmission sensor 30, for example, a time point when the absence of blockage of light changes to the presence of blockage of light. At the same time, the control device 11 identifies, at an operation part 303, a movement amount of the spline shaft 13 detected at a position detection part 302 on the basis of change information of the magnetized magnetic poles of the magnetic scale 28, which change information is supplied from the magnetic sensor 29. A driving part 305 controls the power supply to the voice coil motor 21 on the basis of the identified movement of the spline shaft 13; thus controlling the operation of the voice coil motor 21. Upon necessity, the movement of the spline shaft 13 identified at the operation part 303, etc. is recorded to a memory 304.

Meanwhile, an origin of the slide shaft 410 is detected by the potentiometer 416 in the conventional apparatus of FIG. 6. Since the potentiometer requires an origin detection band of a predetermined breadth on the circumference of the shaft moving up and down to obtain an origin signal, the origin is not determined at one point and spans a width. The origin cannot be detected accurately and also an origin detection band area is difficult to form at the same position in the circumferential direction.

According to the embodiment of the present invention, the transmission sensor 30 is set in a noncontact state with the magnetic scale 28 at the leading end of the magnetic scale 28 to detect the presence/absence of blockage of light by the leading end of the magnetic scale 28, thereby detecting a position of the origin. The origin can be detected more accurately than in the prior art. Moreover, since it is enough to detect merely the presence/absence of blockage of light by the leading end of the magnetic scale 28, the position of the origin can be detected accurately at the same position in the circumferential direction as well.

Figure 3:
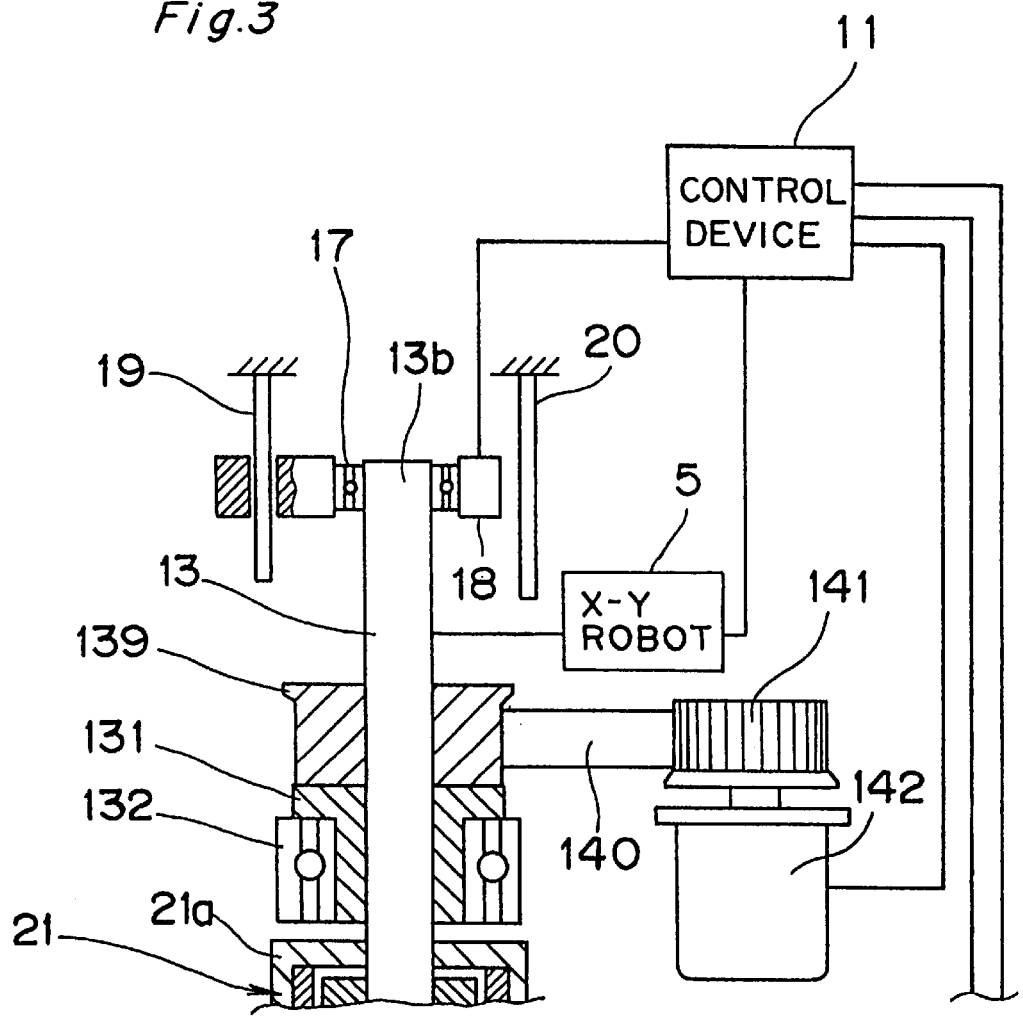
FIG. 3 is a view of a different embodiment of a detecting device.

The detecting device can be constituted from a different structure, e.g., as shown in FIG. 3, although it is slightly more complicated than the above described detecting device. Specifically, a magnetic sensor 18 corresponding to the above-described magnetic sensor 29 is fixed via a bearing 17 to the other end part 13b of the spline shaft 13. The reason for the bearing 17 is to prevent the magnetic sensor 18 from rotating interlockingly with the rotation of the spline shaft 13 in the circumferential direction. Further, a part of the magnetic sensor 18 is engaged with a stop shaft 19 so that the magnetic sensor 18 can move in the axial direction of the spline shaft 13, but cannot rotate in the circumferential direction. The stop shaft 19 is fixed to the component suction head part 6 and extends in parallel to the axial direction. The magnetic sensor 18 is hence rendered movable in the axial direction while the magnetic sensor 18 is hindered from rotating in the circumferential direction. The magnetic scale 20, similar to the earlier-described magnetic scale 28, is secured to the component suction head part 6 in a state not to be in contact with the magnetic sensor 18 within a movement range of the magnetic sensor 18. The magnetic sensor 18 is connected to the control device 11.

The detecting device for detecting the amount of axial movement of the spline shaft 13 is not limited to the above-described magnetic scales 28, 20, magnetic sensors 29, 18, and transmission sensor 30. Any known instrument that can measure the movement amount of the spline shaft 13 is employable.

The component mounting apparatus including the component suction head part 6 of the embodiment constituted as above operates in the following fashion.

Under the control of the control device 11, the transfer part 2 carries in the electronic circuit board 1 from a previous process and supports the circuit board at a mount position. In the meantime, the transmission sensor 30, set at the component suction head part 6, detects the origin of the movement of the spline shaft 13 when the light is blocked by the leading end of the magnetic scale 28. The detected information of the origin is fed from the transmission sensor 30 to the control device 11.

Subsequently, because of the control by the control device 11, the X-Y robot 5 moves the component suction head part 6 to a component hold position at the reel-type electronic component feed part 3 or the tray-type electronic component feed part 4.

When power is supplied to the voice coil motor 21 by the control of the control device 11, the spline shaft 13 is descended. At this time, the control device 11 controls a descent amount of the spline shaft 13 on the basis of output information from the magnetic sensor 29 in consequence of the downward movement of the magnetic scale 28. After the voice coil motor 21 is driven, thereby lowering the spline shaft 13 and the nozzle 8, the sucking device 103 starts the suction action under the control of the control device 11. That is, air is sucked from the leading end of the nozzle 8 via the air joint 25, the hole 26, the interior 24 of the voice coil motor 21, the shaft opening 27a, the air hole 27, and the filter 137. When the leading end of the nozzle 8 approaches or comes in contact with the electronic component 138 stored in the reel-type electronic component feed part 3 or the tray-type electronic component feed part 4, the electronic component 138 is sucked to the leading end of the nozzle 8.

After the suction of the electronic component 138, the control device 11 controls the voice coil motor 21 to move the nozzle 8 upward until the magnet 23 of the voice coil motor 21 arrives at the up position 12a. Thereafter, under the control of the control device 11, the X-Y robot moves the component suction head part 6 over the component recognition camera 7, which in turn picks up an image of a suction attitude of the electronic component 138 sucked by the nozzle 8 and sends picked-up image information to the control device 11. Based on the obtained information, if necessary, the control device 11 drives the motor 142 to rotate the spline shaft 13 in the circumferential direction via the belt 140 to correct the position of the suction attitude.

The X-Y robot 5 under the control of the control device 11 moves the component suction head part 6 over the electronic circuit board 1. The control device 11 electrifies the voice coil motor 21 again, whereby the spline shaft 13 and the nozzle 8 move down to mount the sucked electronic component 138 to the component mount position on the circuit board 1.

As described hereinabove, according to the component holding head, the component mounting apparatus equipped with the component holding head, and the component hold method for being carried out by the component mounting apparatus in the embodiment, the spline shaft 13 is moved by the voice coil motor 21 set thereat and, the power supply to the voice coil motor 21 is controlled by the control device 11, thus enabling the spline shaft 13 to move correctly. The pressure applied by the nozzle 8 to the electronic component 138 when the electronic component is sucked by the nozzle 8 and when the sucked electronic component 138 is mounted to the circuit board 1 can be controlled by controlling the power supplied to the voice coil motor 21.

The magnetic scale 28 detecting the movement of the spline shaft 13 is directly coupled to the rigid spline shaft, and similarly the nozzle is directly coupled to the rigid spline shaft 13. Therefore a movement amount of the magnetic scale 28 in response to the movement of the spline shaft 13 in the axial direction perfectly agrees with a movement amount of the nozzle 8 in the axial direction. In the structure adopted in the embodiment of the present invention, a down movement amount of the spline shaft 13 when the leading end of the nozzle 8 is brought into contact with the electronic component 138, and when the electronic component 138 sucked to the nozzle 8 is mounted on the electronic circuit board 1, can be correctly detected by detecting the movement amount of the magnetic scale 28.

Accordingly, the embodiment improves mount quality for the electronic components to the extent that, for example, a mounting error is reduced from 1 $\mu$m to about 0.5 $\mu$m.

Although the spline shaft 13 equipped with the nozzle 8 moves in a vertical direction in the embodiment of the present invention, a movement direction of the spline shaft 13 is not limited to this and can be set to match the component feed parts and circuit boards.

According to the embodiment of the present invention, the component is exemplified by the electronic component, but not restricted to the electronic component, and similarly, the article to which the component is mounted is exemplified by the electronic circuit board and not limited to this.

As is fully described hereinabove, according to the component holding head of the first aspect of the present invention and the component mounting apparatus of the second aspect of the present invention, the voice coil motor for directly driving the shaft is installed at the shaft, and the power supply to the voice coil motor is controlled thereby controlling the movement of the shaft in the axial direction, so that the movement of the shaft in the axial direction is known correctly. Hence the movement of the nozzle set at one end part of the shaft is controlled correctly and thus, the mount quality is improved.

According to the component hold method of the third aspect of the present invention, both the voice coil motor for directly driving the shaft and the detecting device for detecting the movement of the shaft are provided at the shaft. The power supply to the voice coil motor is controlled on the basis of the detected result by the detecting device thereby controlling the movement amount of the shaft, so that the movement of the shaft in the axial direction can be detected correctly. As a result, the movement of the nozzle set at one end part of the shaft is controlled correctly to improve mount quality.

The entire disclosure of Japanese Patent Application No. 8-345069 filed on Dec. 25, 1996, including specification, claims, drawings, and abstract is incorporated herein by reference in its entirety.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A method of operating a component holding head including
   (i) an axially drivable shaft having a nozzle at one end of the shaft for holding a component,
   (ii) a voice coil motor for driving said shaft in an axial direction in response power supplied to said motor, said motor including one of
      (a) a magnet fixed to a circumferential surface of said shaft and a coil surrounding said magnet, and (b) a coil fixed o a circumferential surface of said shaft and a magnet surrounding said coil; and (iii) a detecting device, positioned proximate to said shaft, for detecting movement of said shaft in the axial direction, said detecting device including a member to be detected and a sensor for detecting movement of said member, said method comprising:

using said sensor to detect movement of said member so as to detect movement of said shaft in the axial direction resulting from said shaft being driven by said motor; and controlling power supplied to said motor in response to the movement of said shaft as detected by said detecting device such that the distance that said shaft is driven by said motor in the axial direction is controlled, wherein said member comprises a magnetic scale and said component holding head further includes a transmission sensor positioned in a non-contact state relative to said magnetic scale, and said method further comprises:

using said transmission sensor to detect a presence or absence of blockage of light by a leading end of said magnetic scale such that an origin position of axial movement of said shaft is detected when said magnetic scale axially moves.

2. The method according to claim 1, wherein (i) said motor further includes a casing through which said shaft extends, with said casing including an opening which is in fluid communication with a suction pipe, and (ii) said shaft includes a passage in fluid communication with said nozzle, and also includes an opening interconnecting said passage with said opening in said casing via an interior of said casing, said method further comprising:

holding a component to said nozzle via suction that is created by causing a fluid to flow through said nozzle, through said passage, through said opening interconnecting said passage with said opening in said casing, through the interior of said casing, through said opening in said casing, and then through said suction pipe.

3. The method according to claim 2, wherein controlling the power supplied to said motor in response to the movement of said shaft as detected by said detecting device comprises using a control device to control the power supplied to said motor.

4. A method of operating a component holding head including (i) an axially drivable shaft having a nozzle at one end of the shaft for holding a component, (ii) a motor for driving said shaft in an axial direction in response to power supplied to said motor, said motor including one of (a) a magnet fixed to a circumferential surface of said shaft and a coil surrounding said magnet, and (b) a coil fixed o a circumferential surface of said shaft and a magnet surrounding said coil; and (iii) a detecting device for detecting movement of said shaft in the axial direction, said detecting device including a member to be detected and a sensor for detecting movement of said member, said method comprising:

using said sensor to detect movement of said member so as to detect movement of said shaft in the axial direction resulting from said shaft being driven by said motor; and controlling power supplied to said motor in response to the movement of said shaft as detected by said detecting device such that the distance that said shaft is driven by said motor in the axial direction is controlled, wherein said member comprises a magnetic scale and said component holding head further includes a transmission sensor positioned in a non-contact state relative to said magnetic scale, and said method further comprises:

using said transmission sensor to detect a presence or absence of blockage of light by a leading end of said magnetic scale such that an origin position of axial movement of said shaft is detected when said magnetic scale axially moves.

5. The method according to claim 4, wherein (i) said motor further includes a casing through which said shaft extends, with said casing including an opening which is in fluid communication with a suction pipe, and (ii) said shaft includes a passage in fluid communication with said nozzle, and also includes an opening interconnecting said passage with said opening in said casing via an interior of said casing, said method further comprising:

holding a component to said nozzle via suction that is created by causing a fluid to flow through said nozzle, through said passage, through said opening interconnecting said passage with said opening in said casing, through the interior of said casing, through said opening in said casing, and then through said suction pipe.

6. The method according to claim 4, wherein controlling the power supplied to said motor in response to the movement of said shaft as detected by said detecting device comprises using a control device to control the power supplied to said motor.

* * * * *

UNITED STATES PATENT AND TRADEMARK OFFICE
CERTIFICATE OF CORRECTION

PATENT NO. : 6,748,649 B2
DATED : June 15, 2004
INVENTOR(S) : Osamu Okuda et al.

Page 1 of 1

It is certified that error appears in the above-identified patent and that said Letters Patent is hereby corrected as shown below:

Title page,
Item [62], Related U.S. Application Data, change "Division of application No. 09/331,689, filed June 23, 1999, now Pat. No. 6,343,415." to
-- Divisional of application No. 09/331,689, filed June 23, 1999, now Pat. No. 6,343,415, which is a 371 of PCT/JP97/04799, filed December 24, 1997. --
Item [56], References Cited, FOREIGN PATENT DOCUMENTS, delete "JP 7-266154 10/1997"
Item [57], ABSTRACT,
Line 5, change "shall" to -- shaft --.

Column 10,
Line 64, after "response" insert -- to --.

Column 11,
Line 1, change "fixed o a" to -- fixed to a --.

Column 12,
Line 3, change "fixed o a" to -- fixed to a --.

Signed and Sealed this

Fifth Day of April, 2005

JON W. DUDAS
*Director of the United States Patent and Trademark Office*